United States Patent
Stevens

[11] Patent Number: 5,703,642
[45] Date of Patent: Dec. 30, 1997

[54] FULL DEPLETION MODE CLOCKING OF SOLID-STATE IMAGE SENSORS FOR IMPROVED MTF PERFORMANCE

[75] Inventor: Eric Gordon Stevens, Rochester, N.Y.

[73] Assignee: Eastman Kodak Company, Rochester, N.Y.

[21] Appl. No.: 316,001

[22] Filed: Sep. 30, 1994

[51] Int. Cl.$^6$ .................. H04N 5/335; H04N 3/14
[52] U.S. Cl. .................. 348/317; 348/312; 257/231; 257/242
[58] Field of Search .................. 348/312, 296, 348/293, 157, 311, 317; 437/53; 257/222, 445, 231, 242; H04N 5/335, 3/14

[56] References Cited

U.S. PATENT DOCUMENTS

| | | | |
|---|---|---|---|
| Re. 34,309 | 7/1993 | Tanaka et al. | 348/302 |
| 3,863,065 | 1/1975 | Kosonocky et al. | 257/222 |
| 4,040,092 | 8/1977 | Carnes | 348/249 |
| 4,063,992 | 12/1977 | Hosack | 156/653.1 |
| 4,117,546 | 9/1978 | Anantha et al. | |
| 4,481,522 | 11/1984 | Jastrzebski et al. | 257/229 |
| 4,481,538 | 11/1984 | Battson et al. | 358/517 |
| 4,493,060 | 1/1985 | Varshney | |
| 4,533,940 | 8/1985 | Chappell et al. | 348/293 |
| 4,556,851 | 12/1985 | Levine | |
| 4,580,155 | 4/1986 | Tsoi et al. | |
| 4,656,361 | 4/1987 | McIntyre | 348/301 |
| 4,656,518 | 4/1987 | Kosonocky et al. | 348/320 |
| 4,720,746 | 1/1988 | Moore | 348/315 |
| 4,743,971 | 5/1988 | Hugli | 348/157 |
| 4,831,453 | 5/1989 | Takemura | 348/296 |
| 4,862,273 | 8/1989 | Ishida et al. | 348/296 |
| 4,963,952 | 10/1990 | Janesick | 257/228 |
| 5,005,063 | 4/1991 | Janesick | 257/227 |
| 5,077,592 | 12/1991 | Janesick | 257/248 |
| 5,130,774 | 7/1992 | Stevens et al. | 257/445 |
| 5,144,444 | 9/1992 | MacLean | 348/312 |
| 5,151,380 | 9/1992 | Hynecek | 437/53 |
| 5,270,558 | 12/1993 | Reich et al. | |
| 5,283,450 | 2/1994 | Harada | |

*Primary Examiner*—Andrew Faile
*Assistant Examiner*—Andrew B. Christensen
*Attorney, Agent, or Firm*—James D. Leimbach

[57] ABSTRACT

The present invention teaches how to maintain temporally the increased collection region (depletion depth) of detectors within a solid-state image sensor. A novel clocking method is used to control charge transfer within charge coupled devices to reduce cross talk with a resulting improvement in the MTF and quantum efficiency. Specifically, the present invention employs a pulsing type of clocking technique wherein the duty cycle is adjusted to maximize the depletion region. These pulses are spaced equally from phase to phase within the multiphase clocking scheme. The present invention is specifically designed for high speed CCD devices in which improvements in the MTF and QE are desired. Time Delay Integration (TDI) image sensors are such devices that have high speed characteristics as a common requirement and the application of the present invention to these devices is discussed. Additionally, the application of the present invention to certain full frame and frame transfer devices having requirements for high speed characteristics will benefit from the teachings of the present invention.

19 Claims, 3 Drawing Sheets

FULL DEPLETION MODE CLOCKING OF SOLID-STATE IMAGE SENSORS FOR IMPROVED MTF PERFORMANCE

FIELD OF INVENTION

This invention relates to image sensor devices, and more particularly, to high speed charge coupled devices used as photosensors.

BACKGROUND OF THE INVENTION

A well known performance measure used for charge coupled devices is the Modulation Transfer Function (MTF). The MTF is used as an indication of the resolution capability of a solid-state image sensor and is defined as the modulation of the output signal divided by the modulation of the input signal, versus spatial frequency. It is well known that an increase in depletion depth will increase both Modulation Transfer Function (MTF) and the Quantum Efficiency (QE) of a solid-state, CCD image sensor. It is also well known that by increasing the gate voltage of the CCD will increase this depletion depth.

Generally speaking, it is desirable to maintain a high MTF for good resolution. Although there are several mechanisms which serve to degrade the MTF from the aperture limited value of a solid-state imager, the foremost of these is lateral diffusion of charge carriers within the sensor's substrate, or cross talk. This cross talk is the result of carriers that are generated below the collection regions (surface depletion regions) of the detectors, which move by diffusion to neighboring photosites. This problem is most severe for longer wavelengths where photons are absorbed deeper (due to a lower absorption coefficient within the sensor's substrate material, typically silicon).

One approach to reduce this problem is to build the detectors in a well structure. This structure typically consists of forming the detectors in a well of opposite conductivity type to the substrate. The well and substrate, (forming a p-n junction) are reverse biased to build in an electric field. This field prevents any carriers that are generated deep (below the well) from diffusing back up into neighboring photosites. Although this approach is effective at reducing cross talk, it drastically reduces the quantum efficiency (QE) of the device since these deeply-absorbed carriers are simply lost in the substrate (beneath the well) and not collected. Other approaches, such as forming thin epi layers on heavily doped, low minority carrier lifetime substrates also improve MTF but reduce quantum efficiency in basically the same way, i.e., by throwing away carriers that are generated by the longer wavelength photons.

To reduce dark-current generation, methods such as accumulation-mode clocking or multi-pinned phase (MPP) CCDs have been proposed. However, these methods serve to collapse the depletion regions under the detectors (by using negative gate voltages wrt the substrate) resulting in a degradation of MTF and QE and, therefore, are not desirable for purposes relating to collection efficiency.

It is known within the art of charge coupled devices that two-phase CCD clocks having duty cycles of less than 50% can be used to transfer the charge stored within the CCD. However, the prior art has failed to recognize that certain pulsing techniques with clocks can be effective in increasing the depletion region, the quantum efficiency and the MTF. Furthermore, the prior art has failed to recognize a method and apparatus in which increased depletion results from pulsing techniques employed upon a CCD to transfer charges within the CCD. Furthermore, the prior art has failed to recognize that these pulsing techniques could have advantages with particular CCD devices such as time delay integration (TDI) or full frame (FF) architectures.

These and other shortcomings of the prior art are solved by the teachings of the present invention.

SUMMARY OF THE INVENTION

The present invention discloses a method and apparatus used in increasing the collection region (depletion depth) of the detectors within a solid-state image sensor. The method implements a novel clocking methodology to control charge transfer within charge coupled devices in order to reduce cross talk with a resulting improvement in the MTF and quantum efficiency. Specifically, the present invention employs a two-phase clocking technique having a duty cycle differing greatly from the duty cycle commonly used within the prior art. More particularly, the duty cycle of the two-phase clocks used by the present invention result in clock pulses that are specifically designed to increase, and in fact maximize, charge collection efficiency within the collection region of CCD devices. In TDI devices these pulses are spaced equally from phase to phase within the two-phase clocking scheme. In full frame devices, depletion depth is enhanced during the integration period over what is conventionally achieved with conventional, accumulation, or MPP-mode clocking.

The method and apparatus are specifically designed for high speed CCD devices in which improvements in the MTF and QE are desired. Time Delay Integration (TDI) image sensors are such devices that have high speed characteristics as a common system requirement that would benefit greatly as a result of the improvements taught by the present invention. In fact, the requirement for high speed scanning leads one to use a TDI architecture for higher scanning sensitivity. Additionally, certain full frame devices have high speed characteristics that will benefit from the teachings of the present invention. Devices used to digitize images from large amounts of film, for example, have high speed requirements. It should be understood that other sensor architectures such as frame-transfer imagers, could also be clocked in a similar manner.

Therefore, it is the object of the present invention to overcome the difficulties associated with the current state of the art, by providing a method of clocking an image sensor to improve its MTF without reducing its quantum efficiency.

It is further an object of the invention to provide a CCD device that can used with clocking schemes within the context of the present invention.

It is still further an object of the present invention to provide a CCD based system that can implemented with TDI devices to provide increased depletion areas within the CCD device.

The above and other objects of the present invention will become more apparent when taken in conjunction with the following description and drawings wherein like characters indicate like parts and which drawings form a part of the present invention.

BRIEF DESCRIPTION OF THE DRAWINGS

FIG. 1b is a diagram illustrating the depletion region in a CCD during the first time phase ($t_1$) of the clock of FIG. 1a.

FIG. 1c is a diagram illustrating the depletion region in a CCD during the second time phase ($t_2$) of the clock of FIG. 1a.

FIG. 2b is a diagram illustrating the depletion region in a CCD during the first clock pulse (at time $t_1$) of the present invention of the clock in FIG. 2a.

FIG. 2d is a diagram illustrating the depletion region in a CCD during the second clock pulse (at time $t_3$) of the present invention of the clock in FIG. 2a.

FIG. 3b is a diagram illustrating an expanded view of the preferred method of implementing the full frame rate timing of FIG. 3a.

FIG. 3c is an alternative, clocking scheme to the full-frame rate timing of FIG. 3a.

DETAILED DESCRIPTION OF THE INVENTION

It has been discovered that clocking schemes can be employed to increase the depletion depth within a charge coupled device (CCD) based image sensor. It is well known that increasing the gate voltage of the CCD will yield an increase in the depletion depth. It is also well known that by increasing the depletion depth a resulting increase in both the Modulation Transfer Function (MTF) and the Quantum Efficiency (QE) of a solid-state CCD image sensor will occur.

Figure 1A:
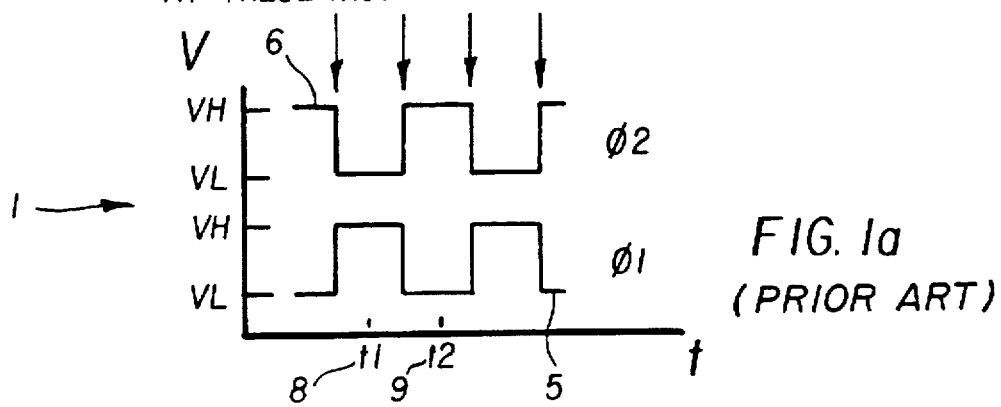
FIG. 1a is a diagram for clock timing typically used for a two-phase CCD having a 50% duty cycle.
Figure 1B:
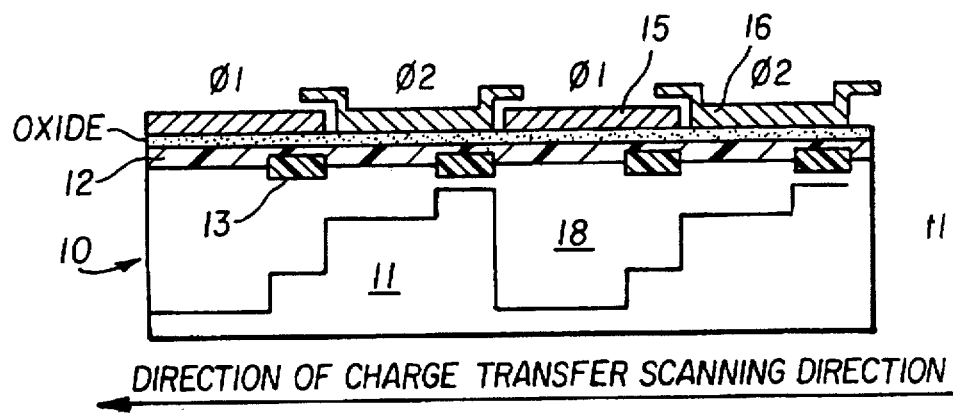
Figure 1C:
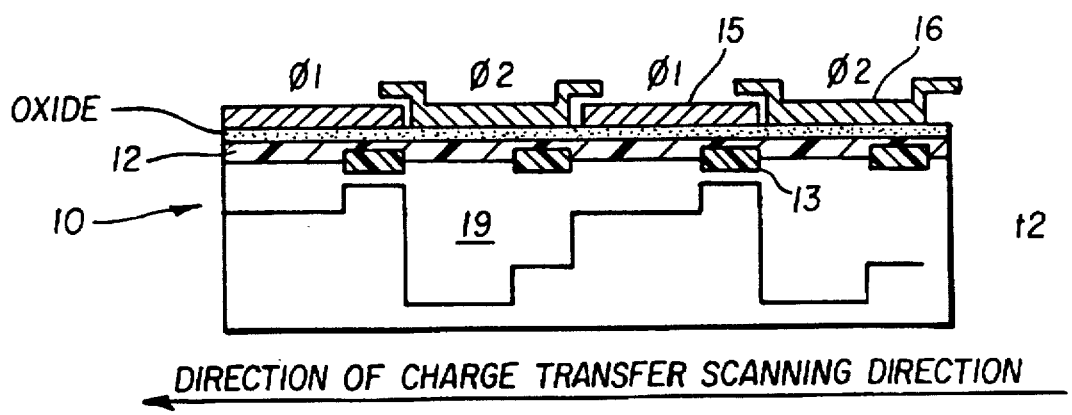

Referring now to FIG. 1(a), an illustration of conventional clocking techniques employed to transfer stored charges within a CCD device, clock phases $\phi_1$ (5) and $\phi_2$ (6) each have a 50% duty cycle and are 180° out of phase. The CCD device that these clock phases (5,6) are applied to is generally referred to as 10, as shown in FIG. 1(b) and FIG. 1(c). The time period $t_1$ (8) seen in FIG. 1(a) has an effect on the CCD (10) which is illustrated by FIG. 1(b), and the time period $t_2$ (9) as shown in FIG. 1(a) has an effect in the CCD (10) as illustrated by FIG. 1(c). The CCD (10) within the preferred embodiment has a p-type substrate (11), an n-type channel (12), p-type barrier (13) as well as electrode (15) for the $\phi_1$ (5) clock phase and electrode (16) for the $\phi_2$ (6) clock phase.

As can be seen in FIG. 1(b) and FIG. 1(c), the charge stored under the electrode $\phi_1$ (15) during the $t_1$ (8) time period is transferred from the depletion region (18) as shown in FIG. 1(b) to the area beneath electrode (16) during the time period $t_2$ (9) created by depletion region (19). Here, the depletion regions beneath the electrodes (15,16) are less in areas having p-type barriers (13) between the substrate (11) and the electrode (15 or 16) than it is beneath the electrode areas without the barrier (13). Barrier (13) in combination with the electrodes (15,16) permits a two-phase clock to be able to transfer the charge in a predetermined direction from one storage region to the next.

Figure 2A:
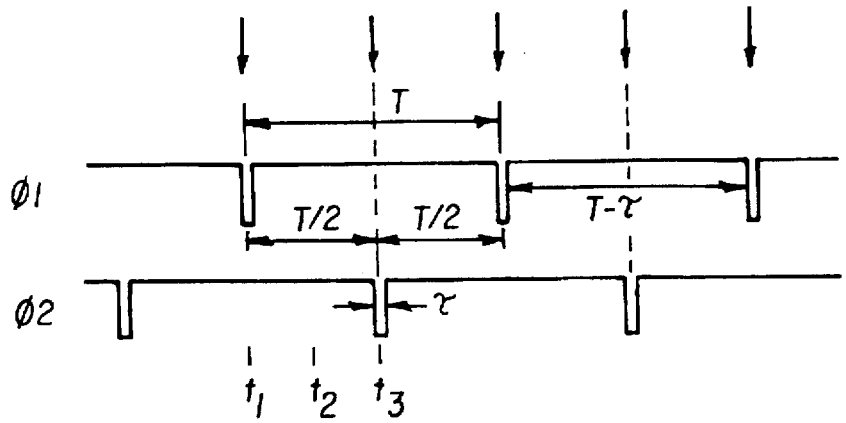
FIG. 2a is a diagram for two-phase clock timing used by the present invention for clocking a two-phase CCD.

Referring now to FIGS. 2(a), (b) and (c), the MTF is used as an indication of the capability of a solid-state image sensor and is defined as the modulation of the output signal divided by the modulation of the sinusoidal input signal versus spatial frequency. The modulation, in the context of MTF, is the contrast of the signal, S, as given by expression in Equation 1 below.

$$MTF = (Smax - Smin)/(Smax + Smin). \quad \text{Equation 1}$$

Where Smax is the maximum value of a modulated signal and Smin is the minimum value.

It is well known within solid-state, CCD image sensors that increasing the depletion depth will improve both MTF and QE. Furthermore, it is well known that increasing the gate voltages of the CCD will result in an increase in the depletion depth that, to the first order, is proportional to the increase in the square root of the channel potential. However, these benefits come at the expense of increasing dark currents, because increasing the CCD gate voltages also increases dark-current generation. Therefore, methods such as accumulation-mode clocking or multi-pinned phase (MPP) CCDs have been proposed. However, these methods serve to collapse the depletion regions under the detectors (by using negative gate voltages with respect to the substrate) resulting in a degradation of MTF and QE. What has not been well appreciated in the prior art is that for devices that operate at high speeds (from tens to hundreds of thousand lines per second) such as TDI devices, and/or for cooled devices, this dark-current generation may be negligible in terms of noise and its impact on dynamic range.

Still referring to FIG. 2, a TDI device, for example, with a depletion-mode dark-current density of 2 nA/cm² (at room temperature) and a pixel size of 64 μ m² the amount of dark signal accumulated would only be 51 electrons at 10,000 lines/sec, or 5 electrons at 100,000 lines/sec with 64 states of TDI. These dark-signal levels correspond to a shot noise of only 7.2 and 2.2 electrons rms, respectively. These levels are well below other typically encountered noise sources, and hence, are negligible. Therefore, in these devices and/or situations, so-called depletion clocking can be used.

In TDI devices, it is important to shift the charge packets along the CCD in equal time intervals during integration to avoid an increase in the temporal smear effect that also degrades MTF. For example, in a two-phase CCD TDI device, the gates are conventionally clocked with a 50% duty cycle. The temporal smear MTF component is given by equation 2.

$$MTF_{smr} = \sin c \ (\pi fp/2) \cos (\pi fpD - 0.5I), \quad \text{Equation 2.}$$

Here, f is the spatial frequency of illumination, p is the pixel's pitch, and D is the duty cycle of the CCD given as a decimal. Equation 2 is valid for a 50% duty cycle as well, and has a maximum value when D=0.5. To run the device with a 50% duty cycle, one phase of the two-phase CCD is normally kept at low potential relative to the other for half of the clock period as shown in FIG. 1a. This results in the potential profile as shown in FIG. 1b. From this figure it can be seen that the depletion regions underneath the phases that are at the lower potential are less than those under the other phases. This result is unfavorable in terms of MTF and QE as discussed above.

Referring to FIG. 2a, temporal smear is minimized by pulsing the clock phases in a manner such that intra phase charge transfer occurs at two equal intervals of time, T/2, within the total time encompassed by one complete clock period. These clock pulses are negative going pulses, and are extremely short in duration (equal to τ) relative to one clock cycle of one phase. It should be noted that the duration of these pulses is limited by the time it takes charge to transfer out of one phase into the next where this time is typically limited by the RC time constant of the gate electrode given by equation 3.

$$\tau = RCL^2 \quad \text{Equation 3}$$

where R and C are the resistance and capacitance of the electrode per a given unit of length, respectively, and L is the length of the electrode.

The short pulse width results in any given gate electrode being at its maximum voltage for most of the clock period (T-τ), thereby, maintaining the maximum depletion width, and hence MTF. It is to be understood that MTF will still be improved even if intraphase charge transfer does not occur exactly at T/2 intervals by virtue of realization of larger depletion regions by having τ<<T. That is to say that the temporal smear is only minimized by transferring charge at equal time intervals according to equation 2 resulting in maximum MTF.

Figure 2B:
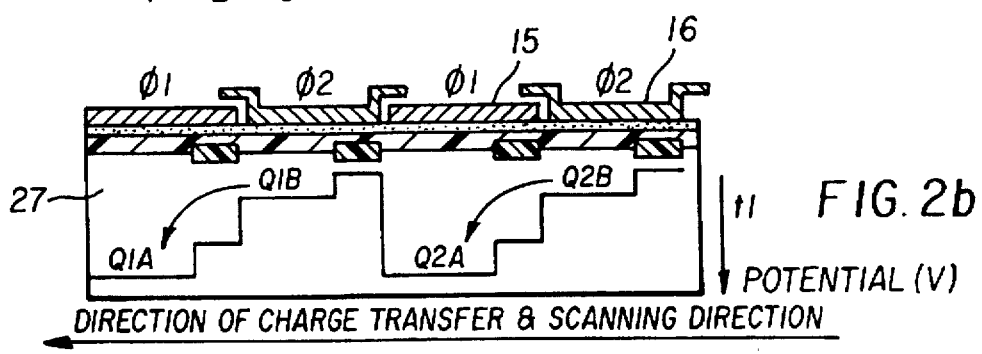
Figure 2C:
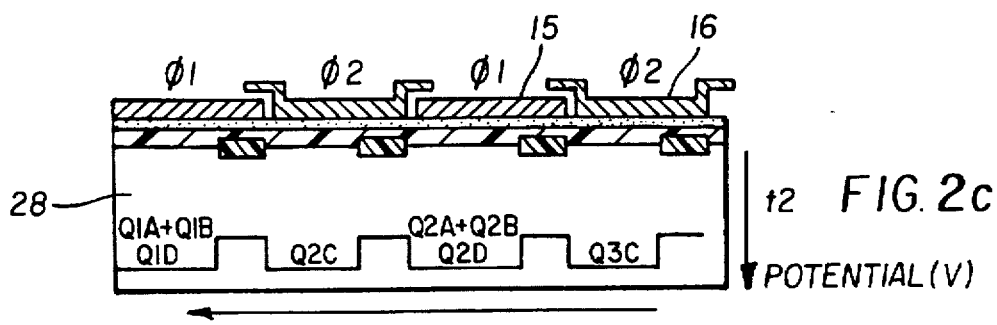
FIG. 2c is a diagram illustrating the depletion region in a CCD between pulses of the clocks used in the present invention.
Figure 2D:
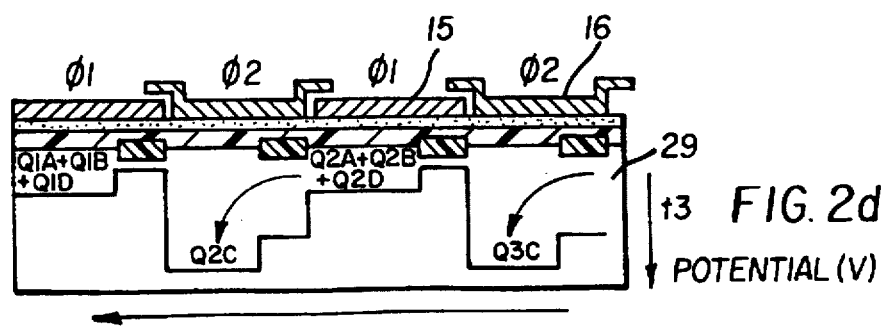

The charge coupled device (10) shown in FIG. 2b, 2c and 2d is identical to that shown in FIG. 1b and FIG. 1c. However, the clock that is applied to the electrodes (15,16) of charge coupled device (10) differs substantially in FIG. 2b, 2c and 2d from that clocking method employed in FIG. 1a. The proposed clocking method (as shown in FIG. 2a) is to keep both phases $\phi_1$ (25) and $\phi_2$ (26) at the higher potential for a larger portion of the clock period, thereby, increasing the depletion regions, or the collection volume. This can be readily observed from FIG. 2c showing the depletion region at $t_2$ (28). By increasing the collection volume a resulting improvement in both the MTF and the QE is achieved.

As can be seen from FIG. 2b, which illustrates the charge coupled device at time $t_1$ (27), the depletion regions are essentially identical to the $t_1$ (8) from FIG. 1b. Note that the circumstances to the clock phase in FIG. 1b and FIG. 2b are the same, i.e. $\phi_1$ (5,15) is at a high potential and $\phi_2$ (6,16) is at a low potential in both FIG. 1b and FIG. 2b. In a similar manner, note that $\phi_2$ in FIG. 1c and $t_3$ in FIG. 2d have the opposite situation where $\phi_1$ (5,15) is at a low potential and $\phi_2$ (6,16) is at a high potential in both FIG. 1c and FIG. 2d. Here, FIG. 2c illustrates a different effect as a result of the novel clocking scheme of the present invention, with both $\phi_1$ (25) and $\phi_2$ (26) at a high potential ($V_H$) for a large fraction of the clock period resulting in increased depletion region (39) at, for example, $\phi_2$. The depletion regions are larger and more uniform, as is indicated at time $t_2$, for a larger fraction of the time. As can also be seen from this figure, the charge packets are kept separated by the barrier-region implants within each phase. These regions form electrostatic barriers, as is well known. It should be noted that the charge is transferred at the shortest possible time interval that is equivalent to what would be achieved with a 50% duty cycle, so that the temporal smear MTF loss is minimized.

It should be noted that the electrodes in FIGS. 1 and FIGS. 2 are true two-phase electrodes. A true two-phase electrode is one having only one level of gate material whether it be polysilicon, indium-tin oxide or some other conductive material used as the gate electrode. The preferred embodiment as shown in the accompanying drawings implements an implanted barrier design within the architecture of the device. However, implanted storage electrodes are also true two-phase electrodes having a single layer of gate material. Pseudo two-phase electrodes are those having at least two layers of gate material used in creating the electrodes of each phase. A stepped oxide design is still another method of forming a two-phase CCD. It should be understood that each of these electrode designs, or others, may be equally employed by the present invention. It should be noted that for a full depletion mode clock to be implemented that there must be some means, either created internally in the sensor, or externally by the system, to create a barrier that separates the charge packets of each individual pixel. The preferred embodiment describes barrier implants. However, these charge packets may have other barrier means internally, or system levels means externally created to facilitate the separation of these charge packets.

Figure 3A:
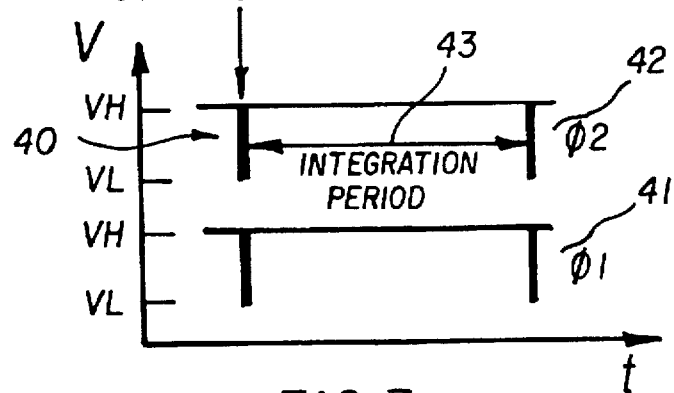
FIG. 3a is a diagram illustrating the two-phase CCD readout timing for full frame devices using the clock pulsing of the present invention.

Referring to FIG. 3a, which is the timing scheme for full frame CCD sensor devices using the clocking method of the present invention, several clocking intervals $\phi 1$ (41) and $\phi_2$ (42) are illustrated. Within these intervals, area (40) is the epoch or time frame in which the actual line rate clocking, or frame readout, is accomplished. The integration period (43) is the time period occurring between epochs. The present invention requires that both phases remain at a high potential during this integration period (43) and this remains true with frame transfer devices. In this manner full depletion mode full-frame and frame-transfer device can be clocked using the techniques of the present invention as discussed below.

Figure 3B:
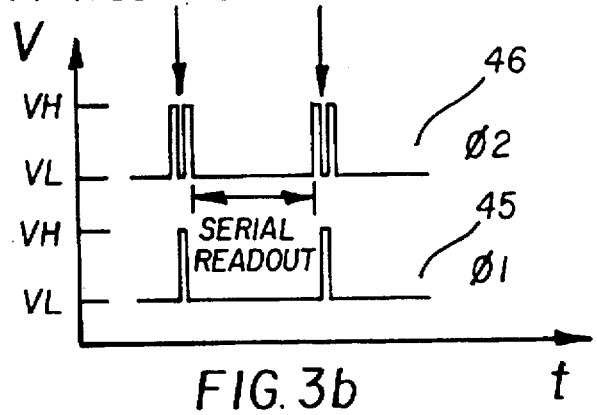
Figure 3C:
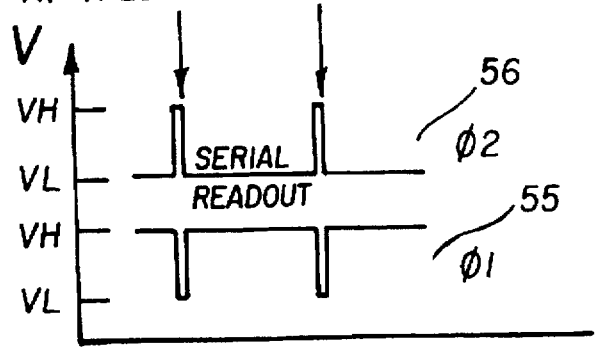

Referring now to FIGS. 3b and 3c in conjunction with FIG. 3a, a clocking scheme can be seen for a full-frame, or frame-transfer device. The clocking of the frame-transfer CCD (not shown) is accomplished in a manner similar to that discussed above, wherein the clocks are pulsed to transfer a frame of data into the storage-frame of the device. It should be noted that In FIGS. 3b and 3c which expand upon area (40) as shown in FIG. 3a, the two series or sets of pulses are two lines being transferred and that typically many more lines would be transferred in such a device. The illustration here is to show how such an embodiment would operate. Certain tradeoffs are employed for the selection of the specific clocking scheme to be used. Among the most important factors considered are integration time for the device and the amount of dark current allowable. FIG. 3a contains an illustration of the two-phase CCD clock timing for a full frame device using the clocking taught by the present invention. The frame rate timing shown here is used for the parallel register clocks. Selected portions of $\phi_1$ (45) and $\phi_2$ (46) have been identified by area (40) which is exploded for further discussion in FIG. 3b and FIG. 3c each of which discuss alternative embodiment for clocking full-frame devices possible within the confines of the present invention.

Referring to FIG. 3b in conjunction with FIG. 3a, the most preferred embodiment for full frame devices can be seen wherein an expanded view of area (40) is illustrated. Here $\phi_1$ (45) has a single pulse between to the short pulses of $\phi_2$ (46). Note that the pulses here are at a high potential and the majority of the phases are at a low potential. Dark currents are reduced by the major portion of the clock phases being at a low potential while a relatively short integration time would be provided for high speed devices.

Referring to FIG. 3c in conjunction with FIG. 3a, an alternative embodiment for full frame devices can be seen wherein an expanded view of area (40) is illustrated. Here $\phi_1$ (55) has a single high pulse with the remainder of the signal being low and $\phi_2$ (56) has a low pulse within a phase that is generally held high. Dark currents are not reduced by the amount of the previous embodiment due to $\phi_1$ (55) being a high voltage and forcing an extended depletion region. While not providing the limitation for dark current as in FIG. 3b, the clocking scheme of FIG. 3c provides the highest speed due to the shortest retrace time.

While there has been shown what is considered to be the preferred embodiment of the invention, it will be manifest that many changes and modifications may be made therein without departing from the essential spirit of the invention. It is intended, therefore, in the annexed claims, to cover all

PARTS LIST

1. Conventional clocks.
2.
3.
4.
5. φ1 clock phase
6. φ2 clock phase
7.
8. $t_1$ time period
9. $t_2$ time period
10. CCD device.
11. P type substrate
12. N type channel
13. P type barrier
14.
φ1 electrode.
φ2 electrode.
17.
18. Depletion region at $t_1$ in FIG. 1b.
19. Depletion region at $t_2$ in FIG. 1c.
20.
21. Clock for present invention
22.
23.
24.
φ1 clock phase for the present invention.
φ2 clock phase for the present invention.
27. Depletion region at $t_1$ in FIG. 1b.
28. Depletion region at $t_2$ in FIG. 1c.
29. Depletion region at $t_3$ in FIG. 1b.
30.
40. Area of FIG. 3a.
41. φ1 clock pulse FIG. 3a
42. φ2 clock pulse FIG. 3a
43. Integration period of FIG. 3a
44. φ1 pulse of FIG. 3c
45. φ1 clock phase for FIG. 3c.
46. φ2 clock phase for FIG. 3c.
47. φ1 clock pulse FIG. 3c
48. φ2 clock pulse FIG. 3c
55. φ1 clock phase for FIG. 3b.
56. φ2 clock phase for FIG. 3b.

I claim:

1. A method of imaging with charge coupled devices (CCD) to reduce lateral diffusion of charge carriers within the CCD by increasing depletion depth comprising the steps of:

employing with an image sensing system having a CCD with clock means for capability of transferring charge under control of a multiphase clock having at least two phases, said clock means having barrier means for separating of charger representative of individual pixels;

capturing image data to be stored and transferred by the CCD via image sensing means by allowing photons to become incident upon photosensors contained on the CCD;

applying to the charge coupled device the multiphase clock having n phases, each phase having a substantially larger duty cycle in a first logic state that increases depletion depth within the CCD as compared to a second logic state that does not increase depletion within the CCD as much as the first logic state; and arranging each phase of the multiphase clock such that all phases of the multiphase clock exist at the first logic state during integration periods for the CCD.

2. The method of claim 1 wherein the step of employing the image sensing system with a CCD capable of transferring charge under control of a multiphase clock further comprises, employing a charge coupled device having a p-type substrate, an n-type buried channel, electrode means for implementation of a two-phase clock.

3. The method of claim 2 wherein the step of employing the image sensing system with a CCD further comprises as the electrode means for implementation of a two-phase clock, electrodes having at least one conductive level per phase comprising one from the following: stepped oxides; implanted barrier; implanted storage; or a combination thereof.

4. The method of claim 1 wherein the step of applying further comprises positioning pulses of the second logic state in each phase at equal time intervals in order to reduce temporal smear.

5. The method of claim 1 wherein the CCD is a time delay integration device and the arranging step further comprises each phase of the multiphase clock having the second logic state opposite the depletion depth increasing first logic state such that interphase charge transfer occurs within each phase of essentially midway between similar pulses of the previous phase and the next phase.

6. The method of claim 1 wherein the CCD device is a full frame device and the arranging step further comprises in addition to having each phase of the multiphase clock exist at the first logic state during integration periods having each phase perform at least one pulse during frame read out periods.

7. An image sensing system comprising:

a charged coupled device (CCD) having image sensing means for allowing photons from an image to be stored in cells within the CCD;

clock input means for allowing a multiphase clock to transfer stored charges within the CCD in a manner determined by CCD architecture from one cell to an adjacent cell;

a clock generator that can generate multiphase clocks, having a first potential that creates a deep depletion region within the CCD and a second potential that does not create as deep a depletion region within the CCD;

timing means for applying the clock generator such that the first potential of each phase is active during integration periods of the CCD and for creating at least one pulse of the second potential within each phase during readout periods; and barrier means for separation of stored charges between each pixel.

8. The invention of claim 7 wherein the charge coupled device further comprises:

a p-type substrate having a major surface;

a n-type buried channel formed adjacent the major surface of the p-type substrate;

a dielectric formed adjacent the n-type buried channel on a side opposite the p-type substrate;

a plurality of clock electrodes formed adjacent the dielectric on a surface opposite the dielectric; and a plurality of barrier regions within the channel region used to form the barrier means, smaller than and underneath the electrodes, such that there is one of the barrier region for each of the electrodes and arranged such that the barrier regions are located at the portion of the electrode opposite the direction of charge travel within the n-type channel region of the charged coupled device.

9. The invention of claim 7 wherein the CCD is a time delay integration device and the timing means further comprise pulsing means for creating pulses of the second potential for each phase that occur essentially midway between pulses of previous and next phases.

10. The invention of claim 7 wherein the CCD is a full-frame sensor and the timing means further comprise in addition to the first potential of each phase which is active during integration periods, a second potential which may be active during frame readout periods and pulsing means for pulsing between first and second potential during frame readout periods.

11. A method of reducing lateral diffusion within an image sensor comprising the steps of:

employing an image sensor having a photosensor array formed by a charged coupled device having cells constructed with a substrate doped of a first conductivity type, a buried channel doped of a second conductivity type having opposite polarity from the first conductivity type adjacent the substrate, and electrode means for allowing application of a clocking potential to transfer charge from one cell to another, the electrode means having barrier means for assisting pixel separation under full depletion mode conditions;

capturing image data within the image sensor by allowing photons to become incident upon photosensors contained on the charge coupled device;

applying a multiphase clock to the electrode means, such that sequential phases of the clock are applied to adjacent electrodes, each phase of the multiphase clock having a first state with a potential to create a large depletion region within the substrate; and holding each phase of the multiphase clock in the first state for integration periods, thereby, creating an increase depletion region under all phases within the substrate.

12. The method of claim 11 further comprising the steps of:

employing a time delay integration device as the CCD; and pulsing each phase of the multiphase clock in a second state that does not create as large depletion within the CCD substrate as the first state in sequential order from one phase to the next such that each phase will have pulses occurring essentially midway between last and next phases having substantially shorter duration than the duration of the first state, in a manner such that charge is transferred from underneath one electrode to the next.

13. The method of claim 11 wherein the step of employing an image sensor further comprises employing the charge coupled device having a plurality of barrier regions within the channel being positioned under a portion of the electrode means from which charge transfer will begin and separated from each other, and creating a depletion region within the substrate.

14. The method of claim 11 wherein the step of employing the image sensor has a charge coupled device and the electrode means are fashioned for implementation of a two-phase clock employing either true two-phase or pseudo two-phase electrodes.

15. The method of claim 11 wherein the step of employing further comprises employing a full frame CCD device and the step of holding further comprises pulsing each phase of the multiphase clock during frame read out periods.

16. A method of reducing lateral diffusion within an image sensor comprising the steps of:

employing an image sensor having a photosensor array formed by a charged coupled device, having electrode means for allowing application of a potential to the charge coupled device and barrier means for assisting charge transfer and pixel separation within the charge coupled device;

capturing image data to be stored and transferred by the image sensor by allowing photons to become incident upon photosensors contained on the charge coupled device;

applying a multiphase clock to the electrode means, such that sequential phases of the clock are applied to adjacent electrodes, each phase of the multiphase clock having a first state with a potential to create a large depletion region within the substrate;

pulsing each phase of the multiphase clock in a second state that does not create as large depletion within the CCD substrate as the first state in sequential order from one phase to the next such that each phase will have pulses occurring essentially midway between last and next phases having substantially shorter duration than the duration of the first state, in a manner such that charge is transferred from underneath one electrode to the next; and holding each phase of the multiphase clock in the first state for integration periods, thereby, creating an increased depletion region under all phases within the substrate.

17. The method of claim 16 wherein the step of employing further comprises employing a time delay integration device as the CCD.

18. The method of claim 16 wherein the step of employing further comprises the CCD having cells constructed with a substrate doped of a first conductivity type, a buried channel adjacent the substrate doped of a second conductivity type having opposite polarity from the first conductivity type.

19. The method of claim 16 wherein the step of employing the image sensing system with a CCD further comprises as the electrode means, means for implementation of a two-phase clock having electrodes with at least one conductive layer comprised from one of the following: stepped oxides; implanted barrier; implanted storage; or a combination thereof.

* * * * *